US008372194B1

(12) United States Patent
Zürcher et al.

(10) Patent No.: US 8,372,194 B1
(45) Date of Patent: Feb. 12, 2013

(54) METHODS OF FORMING A DOPED SEMICONDUCTOR THIN FILM, DOPED SEMICONDUCTOR THIN FILM STRUCTURES, DOPED SILANE COMPOSITIONS, AND METHODS OF MAKING SUCH COMPOSITIONS

(75) Inventors: Fabio Zürcher, Brisbane, CA (US); Wenzhuo Guo, Cupertino, CA (US); Joerg Rockenberger, Redwood City, CA (US); Vladimir K. Dioumaev, Mountain View, CA (US); Brent Ridley, San Carlos, CA (US); Klaus Kunze, Albuquerque, NM (US); James Montague Cleeves, Redwood City, CA (US)

(73) Assignee: Kovio, Inc., San Jose, CA (US)

( * ) Notice: Subject to any disclaimer, the term of this patent is extended or adjusted under 35 U.S.C. 154(b) by 528 days.

(21) Appl. No.: 12/020,481

(22) Filed: Jan. 25, 2008

Related U.S. Application Data

(60) Continuation of application No. 11/455,976, filed on Jun. 19, 2006, now Pat. No. 7,981,482, and a continuation of application No. 11/455,363, filed on Jun. 16, 2006, now abandoned, which is a division of application No. 10/949,013, filed on Sep. 24, 2004, now Pat. No. 7,314,513.

(51) Int. Cl.
*C09D 183/16* (2006.01)

(52) U.S. Cl. ........... 106/287.14; 106/287.19; 252/182.3; 252/182.33; 252/182.35; 252/182.32

(58) Field of Classification Search ............. 106/287.14, 106/287.19; 252/182.3, 182.33, 182.35, 252/182.32
See application file for complete search history.

(56) References Cited

U.S. PATENT DOCUMENTS

| | | | |
|---|---|---|---|
| 4,554,180 A | 11/1985 | Hirooka | |
| 4,683,145 A | 7/1987 | Nishimura | |
| 4,683,146 A | 7/1987 | Hirai | |
| 4,726,963 A | 2/1988 | Ishihara | |
| 4,830,890 A | 5/1989 | Kanai | |
| 4,841,083 A | 6/1989 | Nagai | |
| 5,198,387 A | 3/1993 | Tang | |
| 5,379,720 A | 1/1995 | Kuramata | |
| 5,866,471 A * | 2/1999 | Beppu et al. ................ | 438/502 |
| 6,027,705 A | 2/2000 | Kitsuno | |
| 6,429,095 B1 | 8/2002 | Sakaguchi et al. | |
| 6,517,911 B1 | 2/2003 | Matsuki | |
| 6,518,087 B1 | 2/2003 | Furusawa | |
| 6,527,847 B1 | 3/2003 | Matsuki | |
| 6,541,354 B1 | 4/2003 | Shimoda | |
| 6,593,591 B2 | 7/2003 | Yudasaka et al. | |
| 6,767,775 B1 | 7/2004 | Yudasaka | |
| 6,884,700 B2 | 4/2005 | Aoki | |
| 7,071,125 B2 | 7/2006 | McSwiney et al. | |
| 7,186,630 B2 | 3/2007 | Todd | |
| 7,335,266 B2 | 2/2008 | Fu et al. | |
| 2003/0022528 A1 | 1/2003 | Todd | |
| 2003/0045632 A1* | 3/2003 | Shiho et al. ................ | 524/861 |
| 2003/0148024 A1 | 8/2003 | Kodas et al. | |
| 2003/0229190 A1 | 12/2003 | Aoki | |
| 2005/0008880 A1 | 1/2005 | Kunze et al. | |
| 2005/0176183 A1 | 8/2005 | Aoki | |

FOREIGN PATENT DOCUMENTS

| | | |
|---|---|---|
| GB | 2077710 B | 10/1983 |
| JP | 60242612 A | 12/1985 |
| JP | 6191821 A | 7/1994 |
| JP | 7267621 A | 10/1995 |
| JP | 945922 A | 2/1997 |
| JP | 200031066 A | 1/2000 |
| WO | 0059041 A1 | 10/2000 |

OTHER PUBLICATIONS

Tsutomu Takadera, Keiichi Fukuyama, Akira Sakawaki, Kotaro Yano, and Yutaka Kitsuno; Method for Forming Silicon Film and Manufacture of Solar Battery; Patent Abstracts of Japan; Publication Date: Jan. 28, 2000; Publication No. 2000-031066; Japanese Patent Office; Japan.

Yutaka Kitsuno, Kotaro Yano, Akira Sakawaki, and Keiji Kawasaki; Method for Forming Poly Crystal Silicon Film; Patent Abstracts of Japan; Publication Date: Feb. 14, 1997; Publication No. 09045922 A; Japanese Patent Office; Japan.

Kotaro Yano, Yutaka Kitsuno, Akira Sakawaki, and Keiji Kawasaki; Formation of Silicon Membrane; Patent Abstracts of Japan; Publication Date: Oct. 17, 1995; Publication No. 07267621 A; Japanese Patent Office; Japan.

Kotaro Yano, Yutaka Kitsuno, Shoichi Tazawa, and Keiji Kawasaki; Higher Order Silane Containing Solution for Forming Silicon Film; Patent Abstracts of Japan; Publication Date: Jul. 12, 1994; Publication No. 06191821 A; Japanese Patent Office; Japan.

Yukio Nishimura, Hiroshi Matsuda, Masahiro Haruta, Yutaka Hirai, Takeshi Eguchi, and Takashi Katagiri; Deposition Film Forming Method; Patent Abstracts of Japan; Publication Date: Dec. 2, 1985; Publication No. 60242612 A; Japanese Patent Office; Japan.

(Continued)

*Primary Examiner* — Margaret Moore
(74) *Attorney, Agent, or Firm* — Andrew D. Fortney

(57) ABSTRACT

Methods for forming doped silane and/or semiconductor thin films, doped liquid phase silane compositions useful in such methods, and doped semiconductor thin films and structures. The composition is generally liquid at ambient temperatures and includes a Group IVA atom source and a dopant source. By irradiating a doped liquid silane during at least part of its deposition, a thin, substantially uniform doped oligomerized/polymerized silane film may be formed on a substrate. Such irradiation is believed to convert the doped silane film into a relatively high-molecular weight species with relatively high viscosity and relatively low volatility, typically by cross-linking, isomerization, oligomerization and/or polymerization. A film formed by the irradiation of doped liquid silanes can later be converted (generally by heating and annealing/recrystallization) into a doped, hydrogenated, amorphous silicon film or a doped, at least partially polycrystalline silicon film suitable for electronic devices. Thus, the present invention enables use of high throughput, low cost equipment and techniques for making doped semiconductor films of commercial quality and quantity from doped "liquid silicon."

21 Claims, 3 Drawing Sheets

OTHER PUBLICATIONS

Uwe Herzog and Robert West; Heterosubstituted Polysilanes; Macromolecules; Publication Date: Mar. 9, 1999; pp. 2210-2214; vol. 32; American Chemical Society.

Tsutomu Takadera, Keiichi Fukuyama, Akira Sakawaki, Kotaro Yano, and Yutaka Kitsuno; "Method for Forming Silicon Film and Manufacture of Solar Battery"; Patent Abstracts of Japan; Publication No. 2000031066 A; Publication Date: Jan. 28, 2000; Japan.

Waltraud Gollner, Karin Renger, and Harald Stueger; "Linear and Cyclic Polysilanes Containing the Bis (trimethylsilyl)amino Group: Synthesis, Reactions, and Spectroscopic Characterization"; American Chemical Society; 2003; pp. 4579-4584; vol. 42, No. 15; US.

Takako Kudo, Satoru Akiba, and Yoriko Kondo; Hamao Watanabe; Keiji Morokuma and Thom Vreven; "Ab Initio Study of the Effect of Heteroatoms and Bulky Substituents on the Strain Energies of Cyclosilanes"; American Chemical Society; 2003; pp. 4721-4724; vol. 22, No. 23; US.

Richard T. Oakley, David A. Stanislawski, and Robert West; "Cyclic Polysilanes"; Journal of Organometallic Chemistry; 1978; pp. 389-404; vol. 157, No. 4; US.

Wenzhuo Guo et al.; "Heterocyclic Semiconductor Precursor Compounds, Compositions Containing the Same, and Methods of Making Such Compounds and Compositions"; U.S. Appl. No. 10/950,373, filed Sep. 24, 2004.

\* cited by examiner

METHODS OF FORMING A DOPED SEMICONDUCTOR THIN FILM, DOPED SEMICONDUCTOR THIN FILM STRUCTURES, DOPED SILANE COMPOSITIONS, AND METHODS OF MAKING SUCH COMPOSITIONS

RELATED APPLICATIONS

This application is a continuation of U.S. application Ser. No. 11/455,363 (Jun. 16, 2006), now abandoned, and U.S. application Ser. No. 11/455,976 (Jun. 19, 2006) now U.S. Pat. No. 7,981,482, each of which is a divisional of U.S. Ser. No. 10/949,013 (Sep. 24, 2004), now U.S. Pat. No. 7,314,513.

FIELD OF THE INVENTION

The present invention generally relates to the fields of doped silane and semiconductor thin films and thin film structures, methods of forming doped silane and semiconductor thin films, and doped liquid phase silane compositions useful in such methods.

DISCUSSION OF THE BACKGROUND

There are a number of silanes that are liquid at ambient temperatures (e.g., from about 15° C. to about 30° C.) or that can be formulated into an ink composition that is liquid at ambient temperatures. Liquid silanes, such as cyclopentasilane or cyclohexasilane, have been investigated as candidate "liquid silicon" precursors. However, to date, it has been challenging to make semiconducting thin films of commercial qualities and quantities from "liquid silicon" precursors. One such challenge has related to doping such "liquid silicon" precursors and/or the films formed therefrom.

Methods have been proposed for covalently binding dopant atoms such as phosphorous and boron to silicon atoms in certain liquid (cyclo)silanes. For example, photochemical reactions between (cyclo)silanes and certain phosphines and/or boranes are disclosed in U.S. Pat. No. 4,683,145 and U.S. Patent Publication No. 2003/0229190. Heterocyclic doped silanes are disclosed in U.S. Pat. No. 6,527,847 and U.S. Patent Publication No. 2003/0045632, and a method for synthesizing such doped silanes is disclosed in U.S. Pat. No. 6,527,847. The properties of thin films formed from such compounds are somewhat disappointing, given the relative proportion of dopant atoms in the film-forming mixture. Also, the results are not quite as reproducible as would be generally desired for commercial applications.

The mechanisms behind the disappointing results are not well understood. However, there may be a number of critical steps involved in forming doped semiconducting films from doped liquid silanes, such as forming the covalent bonds between dopant atoms and silicon, preserving these covalent bonds during subsequent synthesis steps and in initial processing steps to form a thin film or thin film structure, and activating the dopant atoms once the thin film or thin film structure is formed.

Thus, there has been a long-felt need in the art for a "liquid silicon" compound and/or composition, particularly a doped "liquid silicon." Such a composition would primarily comprise silicon atoms (other than solvent, to the extent any solvent is present as a main component), would include a dopant or dopant precursor, would be liquid at ambient temperatures (to facilitate handling, deposition and further processing), and would yield commercial quality doped semiconducting films upon subsequent processing (e.g., annealing or curing). However, to date, methods of making a thin doped semiconducting film or film structure from liquid silanes have not been sufficiently reliable for high-volume commercial use.

SUMMARY OF THE INVENTION

Embodiments of the present invention relate to doped silane and/or semiconductor thin film structures, methods of forming doped silane and/or semiconductor thin films, and doped liquid phase silane compositions useful in such methods. In one aspect, the present invention concerns a method of coating a substrate, comprising the steps of (a) coating the substrate with a liquid phase composition comprising a doped silane; and (b) irradiating the liquid phase composition sufficiently to (i) cross-link, isomerize, oligomerize and/or polymerize the doped silane, (ii) form a substantially uniform layer on the substrate, the layer comprising a doped oligo- and/or polysilane, and/or (iii) increase an average molecular weight, increase a viscosity and/or reduce a volatility of the composition. At least part of the irradiating step is performed during at least part of the coating step. Optionally, the method may form a thin film pattern, and may comprise printing a liquid phase composition comprising a doped silane in a pattern on a substrate and irradiating the composition and/or pattern.

In another aspect, the present invention further relates to a method of making a doped semiconductor film, comprising the steps of (1) curing an at least partially crosslinked, oligomerized and/or polymerized doped silane film to form a cured doped semiconductor layer (which may be hydrogenated and/or amorphous); and (2) annealing the cured doped semiconductor layer sufficiently to at least partially activate the dopant and form the doped semiconductor film. It is believed that annealing (i) activates at least a portion of the dopant and (ii) may (re)crystallize the semiconductor film. This aspect of the invention is useful for making device structures (such as transistor terminals, diodes, resistors and/or capacitor plates). Thus, in a further aspect, the present invention relates to doped semiconductor thin film structures and device structures that may be made using one or more of the present methods.

The present invention also relates to doped liquid phase silane, germane and silagermane compositions, generally comprising a Group IVA atom source and a dopant source. The Group IVA atom source and the dopant source may be separate compounds and/or groups or parts in the same compound. In certain embodiments, the doped liquid phase compositions may further comprise a solvent.

The present inventors have discovered that a thin, substantially uniform doped oligomerized/polymerized silane film may be deposited onto a substrate by conversion of a doped liquid silane composition into a relatively high-molecular weight species with relatively high viscosity and relatively low volatility. Such conversion (typically by cross-linking, isomerization, oligomerization and/or polymerization) may be achieved by irradiating the silane film during the coating thereof (preferably by spin-coating) onto the substrate. The film may be irradiated with ultraviolet (UV) light or other form of radiation suitable for inducing cross-linking, isomerization, oligomerization and/or polymerization. Such irradiation generally yields a film of oligomeric and/or polymeric hydrogenated silanes, which can later be converted (generally by heating and [optionally] subsequent laser irradiation) into a doped, hydrogenated, amorphous silicon film or a doped polycrystalline semiconductor film suitable for electronic devices. Thus, the present invention advantageously provides commercial qualities and quantities of doped semiconductor films from a doped "liquid silicon" composition.

These and other advantages of the present invention will become readily apparent from the detailed description of preferred embodiments below.

DETAILED DESCRIPTION OF THE PREFERRED EMBODIMENTS

Figure 1:
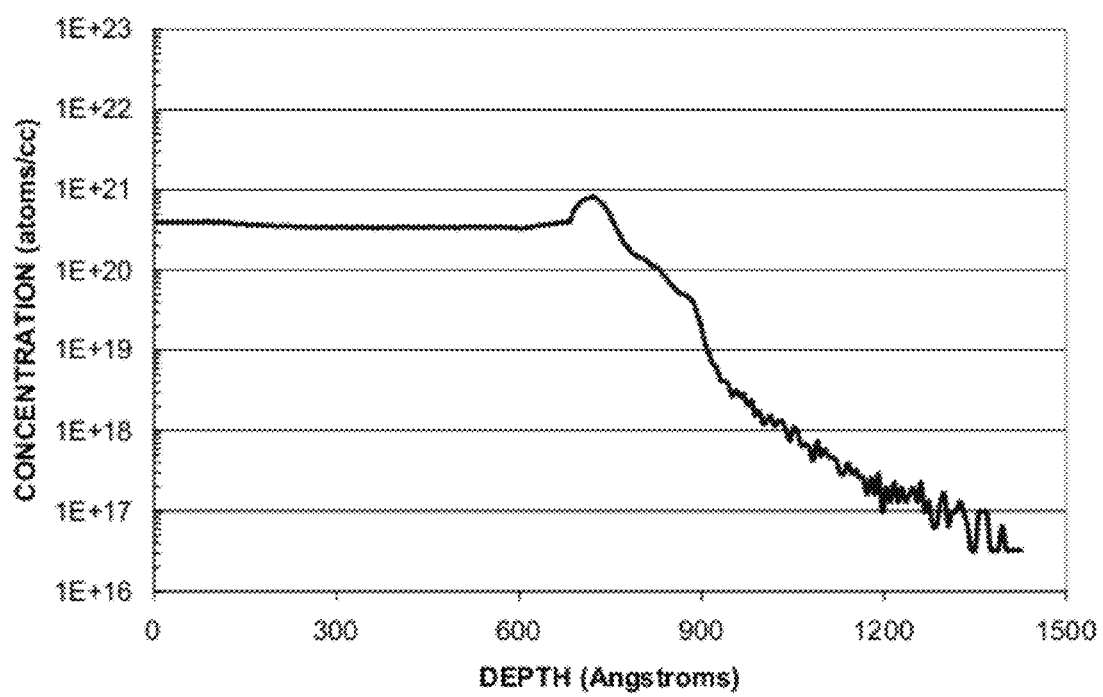
FIG. 1 is a graph showing the dopant concentration/distribution as a function of film depth/thickness in a first exemplary thin film made in accordance with the present invention.

Reference will now be made in detail to the preferred embodiments of the invention, evidence and/or an example of which is shown in the accompanying Figures and in the Table(s) and Example(s) herein below. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "$C_a$-$C_b$ alkyl," "$C_a$-$C_b$ alkoxy," etc., shall refer to both branched and unbranched moieties, to the extent the range from a to b covers 3 or more carbon atoms. Unless otherwise indicated, the terms "arene" and "aryl" refer to both mono- and polycyclic aromatic species. The terms "silane" and "(cyclo)silane" may be used interchangeably herein, and unless expressly indicated otherwise, these terms refer to compounds or mixtures of compounds that consist essentially of (1) silicon and/or germanium and (2) hydrogen. The terms "heterosilane" and "hetero(cyclo)silane" may be used interchangeably herein, and unless expressly indicated otherwise, these terms refer to compounds or mixtures of compounds that consist essentially of (1) silicon and/or germanium, (2) hydrogen, and (3) dopant atoms such as B, P, As or Sb that may be substituted by a conventional hydrocarbon, silane or germane substituent. The term "doped silane" refers to a composition comprising (1) a Group IVA atom source (generally consisting of one or more Group IVA elements [such as Si and/or Ge] and hydrogen) and (2) a dopant source (generally consisting essentially of one or more conventional semiconductor dopant atoms such as B, P, As, or Sb, which may have one or more covalently bound mono- or divalent hydrocarbon or silane substituents), and which may include a single species such as a hetero(cyclo)silane or plural species such as a (cyclo)silane and an organo- or silylphosphine or -borane. The term "semiconductor" refers to a compound or material having semiconducting properties or that contains atoms conventionally associated with semiconducting material (e.g., Si and/or Ge, which may be doped with or bound to conventional dopant atoms such as B, P, As or Sb). The prefix "(cyclo)-" generally refers to a compound or mixture of compounds that may contain a cyclic ring, and the prefix "cyclo-" generally refers to a compound or mixture of compounds that contain a cyclic ring. Somewhat similarly, the term "(re)crystallize" (and grammatical variations thereof) means to crystallize or recrystallize, depending on the morphology of the film immediately prior to a process step effecting such crystallizing or recrystallizing. Also, the term "(spin) coating" refers to the present coating step, which in a preferred embodiment, comprises spin coating.

The phrase "amorphous or polycrystalline" refers to films or thin film structures that contain an amorphous material, a polycrystalline material, or a material that is partially amorphous and partially crystalline or polycrystalline. The term "transistor terminal" may refer to any terminal type of any transistor type, such as a gate, source and/or drain of a conventional thin film transistor (TFT), field effect transistor (e.g., a MOSFET, IGFET, etc.), or a base, collector or emitter of a bipolar transistor (e.g., a BJT, a microwave transistor, a power transistor, etc.). Also, for convenience and simplicity, the terms "part," "portion" and "region" may be used interchangeably, as may the terms "connected to," "coupled with," "coupled to," and "in communication with," but these terms are also generally given their art-recognized meanings.

The present invention concerns a method of coating a substrate with a doped, oligomerized/polymerized silane film, comprising the steps of (a) coating the substrate with a liquid phase composition comprising a doped silane; and (b) irradiating the liquid phase composition sufficiently to (i) cross-link, isomerize, oligomerize and/or polymerize the doped silane, (ii) form a substantially uniform layer on the substrate, the layer comprising a doped oligo- and/or polysilane, and/or (iii) increase an average molecular weight, increase a viscosity and/or reduce a volatility of the composition. At least part of the irradiating step is performed during at least part of the coating step. Optionally, the method may form a thin oligomerized/polymerized silane film pattern, and may comprise printing a liquid phase composition comprising a doped silane in a pattern on a substrate and irradiating the composition.

A further aspect of the invention concerns a method of making a doped semiconductor film, comprising the steps of (1) curing an at least partially crosslinked, oligomerized and/or polymerized doped silane film to form a cured doped semiconductor layer (which may be hydrogenated and/or amorphous); and (2) annealing the cured doped semiconductor layer sufficiently to at least partially activate the dopant and form the doped semiconductor film. It is believed that annealing activates at least a portion of the dopant in the doped film(s) and may (re)crystallize the semiconductor film.

An even further aspect of the present invention relates to doped semiconductor thin film structures and device structures (such as thin film transistor terminals and/or MOS capacitor terminals or plates) that may be made using one or more of the present methods. The thin film transistor generally comprises the doped, amorphous or polycrystalline semiconductor film, a transistor terminal layer above or below the film, and one or more metallization structures in contact with the film. The method of making a transistor or MOS capacitor generally comprises at least one of the present methods of (1) one of (i) coating a substrate with a doped oligomerized/ polymerized silane film or (ii) printing a doped oligomerized/ polymerized silane film in a pattern on a substrate, and/or (2) making a doped amorphous or polycrystalline semiconductor film therefrom, and (3) forming a metallization structure in electrical communication with the film.

The present invention also relates to doped liquid phase silane compositions and method(s) of making such compositions, which generally comprise combining one or more Group IVA atom and dopant source compounds with a solvent (or with another Group IVA atom and/or dopant source compound), and mixing the compound(s) and the solvent/ other compound sufficiently to form a solution.

The invention, in its various aspects, will be explained in greater detail below with regard to exemplary embodiments.

Exemplary Methods of Depositing Doped Liquid Silane Compositions and Making Doped, Oligomerized/Polymerized Silane Films In one aspect, the present invention relates to a method of coating a substrate with a doped oligomerized/polymerized silane film, comprising the steps of: (a) coating the substrate with a liquid phase composition comprising a doped silane; and (b) irradiating the liquid phase composition at least partly during the coating step. Typically, the irradiating step is performed sufficiently to (i) cross-link, isomerize, oligomerize and/or polymerize the doped silane, (ii) form a substantially uniform layer on the substrate, the layer comprising a doped oligo- and/or polysilane, and/or (iii) increase an average molecular weight, increase a viscosity and/or reduce a volatility of the composition. Optionally, the method may form a thin doped oligomerized/polymerized silane film pattern, and may comprise printing a liquid phase composition comprising a doped silane in a pattern on the substrate and irradiating the composition. Thus, in this aspect of the present invention, the term "depositing" (and grammatical variations thereof) encompasses both "coating" and "printing," as well as other forms of deposition, unless the context of such use clearly and unambiguously limits its meaning.

As disclosed in copending U.S. application Ser. No. 10/789,274, filed Feb. 27, 2004, irradiating a liquid-phase silane composition while depositing the composition on a substrate leads to uniform silane film formation, in terms of both film thickness and film coverage over the substrate. An exemplary apparatus for simultaneously coating a substrate with a liquid phase silane composition and irradiating the composition is also disclosed in U.S. application Ser. No. 10/789,274, filed Feb. 27, 2004, the relevant portions of which are incorporated herein by reference.

Without intending to be bound by any particular theory, it is believed that irradiating the composition during coating causes the silane and dopant therein to oligomerize, polymerize and/or crosslink, thereby reducing (i) the volatility of the composition and/or (ii) any tendency of the composition to bead up (a phenomenon believed to be related to the surface tension of the composition), and increasing (A) the viscosity of the composition and/or (B) the average molecular weight of the (doped) silane compound(s) therein. At the same time, irradiating the composition during coating is believed to enable the composition to form a uniform, thin layer using otherwise standard conventional coating techniques (e.g., spin coating). Thus, in various embodiments of the present method, the coating step and the irradiating step may be conducted simultaneously for a length of time of from 1 to 300 seconds, from 3 to 180 seconds, or from 5 to 120 seconds. In one implementation, the coating step and the irradiating step are conducted simultaneously for about 30-35 seconds. When performed as described herein, the present method generally yields a film of doped oligomerized/polymerized silane, covering >80%, >90% or ≧95% of the surface area of the substrate being coated.

However, the coating step in the present invention may comprise spin coating, inkjetting, dip-coating, spray-coating, slit coating, extrusion coating, or meniscus coating the composition onto the substrate. Preferably, the coating step comprises spin coating. Alternatively, in various embodiments of the pattern-forming method, printing may comprise inkjetting, gravure-, offset- or flexo-printing, spray-coating, slit coating, extrusion coating, meniscus coating, microspotting and/or pen-coating the doped silane composition in a pattern or through a stencil onto the substrate (preferably inkjetting). In this case, only predetermined portions of the substrate (generally corresponding to the pattern) are coated with the composition.

In the pattern-forming method, it is not necessary to print the doped silane composition and simultaneously irradiate it. For example, in certain embodiments using inkjet printing technology, the source of radiation may be placed in close proximity to the inkjet head (e.g., within a few mm), but not physically close enough to provide a dose of radiation sufficient to cross-link, isomerize, oligomerize and/or polymerize the doped silane as the composition is being printed onto the substrate (although the substrate and/or inkjet head may move a sufficient distance within less than one to a few seconds for the printed pattern to be irradiated). As a result, the pattern-forming method does not require simultaneous irradiation, although simultaneous irradiation while printing may provide some of the same benefits to pattern-forming methods as it does to coating methods. Also, in a preferred embodiment of the present printing method, the irradiating step may comprise irradiating the printed/patterned composition with ultraviolet (UV) light for less than 1 second. In a high-throughput printing system, the residence (irradiation) time of the doped silane film under a UV lamp is preferably very small. One may compensate for such a short irradiation time by increasing the UV power sufficiently to provide an effective dose of radiation.

With regard to a preferred coating method, spin coating may be conducted at a speed of from 100 to 20,000 revolutions per minute (RPM). In a preferred embodiment, the spin coating is conducted in two stages. Thus, spin coating may comprise (i) a first spin coating stage conducted at a first speed, and (ii) a second spin coating stage conducted at a second speed greater than the first speed. In various implementations, the first speed may be from 100 to 2,000 RPM, from 200 to 1,500 RPM, or from 300 to 1,000 RPM, and the second speed may be from 1,000 to 20,000 RPM, from 1,500 to 15,000 RPM, or from about 2,000 to 10,000 RPM. Of course, one may select any endpoint for the first and/or second speeds from any of these ranges or from within any of these ranges, as long as the second speed is greater than the first speed. For example, the first speed may be from 100 to 1,000 RPM, and the second speed may be from 1,500 to 10,000 RPM. In one such implementation, the first speed is about 500 RPM and the second speed is about 2,000 RPM. In this embodiment, the second speed is usually greater than the first speed by an amount of 2× or more, 3× or more, or 4× or more.

The spin coating step, as well as each stage of the spin coating step (if applicable), may be conducted for a predetermined length of time. For example, the first spin coating stage may be conducted for a first length of time of from 1 to 60 seconds, from 1 to 30 seconds, or from 3 to 10 seconds, and the second spin coating stage may be conducted for a second length of time of from 5 to 300 seconds, from 10 to 120 seconds, or from 15 to 60 seconds. Similar to the spin coating speed(s) described above, one may select any endpoint for any applicable length of spin coating time from any of these ranges or from within any of these ranges. Generally, however, the second length of time is greater than the first length of time.

Similarly, the irradiating step may be conducted for a length of time, for example, of from 3 to 600 seconds, from 5 to 300 seconds, or from 10 to 150 seconds. Alternatively, as for the high-throughput printing embodiment discussed above, the irradiating step may comprise irradiating the spin coated composition with UV light for less than 1 second, optionally compensating for such a short irradiation time by increasing the UV power sufficiently to provide an effective dose of radiation. As for spin coating, one may select any endpoint for any applicable length of irradiating time from any of these ranges, or from within any of these ranges. Generally, however, (spin) coating is performed for a greater length of time than irradiating. In one implementation, the (spin) coating and irradiating steps are stopped at about the same time (approximately simultaneously). While any form of radiation (e.g., an electron beam or light, and more particularly, any wavelength of light) may be used that accomplishes one or more of results (i)-(iii) in paragraph [0022], the irradiating step preferably comprises irradiating with ultraviolet light.

In addition to the irradiating step described above, the present method may further comprise irradiating the doped silane composition prior to the coating step. Such pre-coating irradiation may be at a dose and/or for a length of time sufficient to increase the average molecular weight, increase the viscosity and/or reduce the volatility of the composition containing the doped silane, presumably by oligomerizing, polymerizing and/or crosslinking the silane and dopant compound(s) therein.

The method may further comprise the step of depositing the liquid phase composition onto the substrate prior to the coating step, and the depositing step may further comprise rotating the substrate while depositing the liquid phase composition. While these steps are largely conventional, in one embodiment, the depositing step comprises depositing the liquid phase composition along a radius of the substrate. While the phrase "along a radius of the substrate" is easily understood in the case where the substrate has a substantially circular surface to be coated, this phrase is also applicable in the cases where the surface of the substrate to be coated is substantially square, rectangular, oval, etc. (such as in the case of a flat panel display; see, e.g., U.S. application Ser. No. 10/789,274, filed Feb. 27, 2004, the relevant portions of which are incorporated herein by reference).

When the depositing step includes rotating the substrate, rotating may be conducted at a speed of 500 RPM or less, 300 RPM or less, or 100 RPM or less. In fact, such substrate rotating may be performed manually. If one rotates the substrate while depositing the liquid phase composition thereon, one may effectively coat the entire substrate surface by depositing the composition along a radius of the substrate. Thus, the substrate preferably comprises a securable substrate having a substantially smooth, flat surface upon which the liquid phase composition can be spin coated. In such a case, the substrate may comprise a wafer, plate, disc, sheet and/or foil of a semiconductor (e.g. silicon), a glass, a ceramic, a dielectric, plastic and/or a metal, preferably a member selected from the group consisting of a silicon wafer, a glass plate, a ceramic plate or disc, a plastic sheet or disc, metal foil, a metal sheet or disc, and laminated or layered combinations thereof.

In one embodiment, the liquid phase composition consists essentially of components in the liquid phase at ambient temperatures. Use of all liquid phase components avoids a number of potential problems associated with use of solid-phase components, such as non-uniformities in distribution of the components in the composition (e.g., when the composition is in the form of a colloid or suspension) and/or in the thin film formed on the substrate (e.g., when the solid-phase component[s] move along the substrate surface at a lower rate than the liquid-phase components in the composition).

As described above, the radiation used in the irradiating step preferably comprises ultraviolet light. Typically, such radiation includes light within the range of 200 nm to 440 nm, preferably 220 nm to 400 nm, more preferably from 250 to 380 nm. A suitable source of such radiation may comprise a mercury vapor and/or arc lamp. In the coating embodiments, the power output of the preferred UV lamp may be adjusted to about 0.1-20, 0.25-10 or 0.5-5 milliwatt/cm$^2$. In the printing embodiments, the power output may be higher, since the irradiation time will undoubtedly be in the shorter ends of the irradiation time ranges described in paragraph [0029] above. In either case, the power output of the lamp may be focused at the location of the substrate and/or silane. To adjust the UV intensity at the surface of the substrate, the radiation from the UV lamp may be passed through a mask (e.g., a quartz plate having a chrome pattern of varying density thereon). Alternatively, the UV intensity may be adjusted by regulating the voltage applied to the UV lamp power supply.

In an alternative embodiment, the method may further comprise, after the irradiating step, heating the doped silane film to a temperature of from about 100° C. to about 200° C. to (i) remove some, most or all of the remaining solvent and/or (ii) further oligomerize and/or polymerize the doped silane, prior to subsequent processing. In various sub-embodiments, such heating is conducted for a length of time of from 3 to 60 minutes, 5 to 30 minutes, 10 to 20 minutes, or any time range having endpoints therein. In one implementation, such heating (to remove solvent and/or to oligomerize and/or polymerize the silane) is conducted by placing the substrate on a hot plate under an inert atmosphere, although one could also use a conventional oven or furnace in which the atmosphere can be controlled for such heating.

To help reduce any incidence of inadvertent and/or undesired oxide formation, the coating, printing, irradiating and/or heating step(s) may be conducted under an inert and/or reducing gas atmosphere. Thus, the method may further comprise, prior to any of these steps, the steps of (i) purging an atmosphere in which the substrate is placed, then (ii) introducing an inert and/or reducing gas into the atmosphere. In a preferred embodiment, the composition is coated or printed, irradiated and heated under an inert atmosphere. However, as will be explained below with regard to the method for forming a doped semiconductor film, it may be desirable in some cases to cure the oligomerized/polymerized silane film under a reducing gas atmosphere. In such an embodiment, it may also be convenient to irradiate the oligomerized/polymerized silane film under the reducing gas atmosphere to be used in the curing step.

Particular parameters of the UV spin coating process and recipe can have a strong influence on the properties of the doped amorphous or polycrystalline film resulting from the present coating method, followed by the present curing/annealing method described below. For example, increasing (1) the time of irradiation during spin coating, (2) the percentage (by weight or volume) of silane and/or dopant in the composition, (3) the relative amount of higher molecular weight (hetero)silanes in the composition, (4) the viscosity of the liquid phase composition, (5) the UV irradiation time and/or (6) the UV intensity generally yields a doped, hydrogenated, amorphous semiconductor film and/or doped, at least partially polycrystalline semiconductor film with an increased thickness. Conversely, increasing the spin speed (e.g., during the final stage, the highest-speed stage and/or a stage during which irradiation is simultaneously conducted) generally yields a hydrogenated, amorphous and/or (partially) polycrystalline semiconductor film with a decreased thickness. However, the films may have a less uniform thickness and/or may become more likely to form cracks upon curing if (a) the UV power intensity is too high (generally larger than 0.3 mW/cm$^2$ at a typical silane/dopant loading of ~20 vol % of the spin coating composition), (b) the UV irradiation time is too long, (c) the mass/volume loading of the silane/dopant in the liquid phase composition is too high, and/or (d) the viscosity of the liquid phase composition is too high. Film uniformity and tendency to form cracks appear to be less significant problems in cured patterns formed by inkjetting, presumably because the stress(es) in the inkjetted pattern films/"islands" is less than that of a more uniformly deposited or "blanket" coating film.

Exemplary Methods for Making Doped Semiconductor Thin Films

In another aspect, the present invention concerns a method of making a doped semiconductor film, comprising the steps of: (1) curing an at least partially crosslinked, oligomerized and/or polymerized doped silane (hereinafter, the "doped, oligomerized/polymerized silane") to form a cured doped semiconductor layer (which may also be hydrogenated and/or amorphous); and (2) annealing the cured doped semiconductor layer sufficiently to activate at least part of the dopant and form the doped semiconductor film. Without wishing to be bound by a particular theory, it is believed that annealing activates at least part of the dopant and may (re)crystallize the semiconductor film. In certain embodiments, the doped, oligomerized/polymerized silane is formed by one of the present methods of making a doped, oligomerized/polymerized silane film described above.

The curing step generally comprises heating the doped oligomerized/polymerized silane (which is typically in the form of a film, layer, pattern, or islands) to a temperature of at least about 300° C. (preferably at least about 350° C., and more preferably about 400° C. or higher), generally for a length of time sufficient to cure (e.g., form a doped, and optionally, hydrogenated and/or amorphous semiconductor layer) the doped oligomerized/polymerized silane. Such heating may be conducted for a length of time of at least 1 minute, 3 minutes or 5 minutes. While the maximum heating time may be typically about 30 minutes, 45 minutes, 1 hour or 15 hours, TFT quality silicon films can be obtained after heating at about 300° C. (or more) for several hours (e.g., from 2, 3 or 4 hours to 12, 8 or 6 hours). In one embodiment, curing comprises heating the substrate and the doped oligomerized/polymerized silane layer to a temperature of from about 400° C. to about 500° C., generally for a length of time of about 20 minutes. Alternatively, curing may comprise conventional electron beam curing of the polysilane film.

It is believed that annealing the semiconductor film by irradiating or heating sufficiently (1) electrically activates at least a portion of the dopant in the cured, doped (and optionally, hydrogenated and/or amorphous) semiconductor layer and (2) may crystallize the cured, doped semiconductor layer when it is amorphous; however, under certain conditions, it may be possible to activate at least some of the dopant during the curing step without (re)crystallizing the semiconductor layer to any significant extent to form an activated, doped, amorphous semiconductor layer, or to crystallize the doped amorphous semiconductor layer (e.g., during curing) without activating some or all of the dopant. Without wishing to be bound by any particular theory, it is believed that dopant activation by irradiation (or heating at a sufficiently high temperature) causes dopant atoms in the composition to react with silicon or other Group IVA atoms in or from the silane (thereby chemically "embedding" dopant atoms in the polymerized silane and/or amorphous/polycrystalline semiconductor film), and may enable dopant atoms in the composition to migrate along a lattice of silicon and/or other Group IVA atoms to a position in the lattice where the dopant atoms may have an improved or optimal electrical effect.

Annealing may comprise irradiating (e.g., with light or a conventional electron beam) or heating (e.g., by furnace annealing or rapid thermal annealing) the doped (and optionally, hydrogenated and/or amorphous) semiconductor layer. In one embodiment, annealing comprises irradiating using a laser, which may be rastered in one, two or more dimensions, or which may be selectively focused (e.g., through a mask) on predetermined regions of the doped hydrogenated, amorphous semiconductor film corresponding to a pattern. It may not be necessary to remove non-irradiated portions of a cured film that is subject to laser irradiation through a mask to activate the dopant and, optionally, crystallize the exposed semiconductor film where such non-irradiated portions are not sufficiently electrically active to adversely affect the electrical properties of a device containing such a film. (Re) crystallizing by irradiating generally employs a dose of radiation from a laser sufficient to change the crystalline structure of the cured doped, hydrogenated, amorphous semiconductor layer. Typically, the radiation in the present annealing step comprises light (preferably, ultraviolet [UV] light). The dose of radiation may comprise from 100 to 10,000, from 500 to 5000, or from 1000 to 3000 mJ/cm$^2$ of ultraviolet light. In one embodiment, dopant activation may comprise irradiating with UV light from a conventional UV flash lamp, where the substrate having a doped semiconductor layer thereon is preheated, then flash-irradiated with a dose of UV light sufficient to activate at least part of the dopant.

The present cured, doped semiconductor layer may still contain about 5-15 at % hydrogen after curing at 400-500° C. for less than 1 hour. Laser irradiation of such a film, even at relatively low power densities, may damage the film with minimal or no crystallization. Thus, in embodiments employing laser irradiation (particularly high-power laser irradiation), the hydrogen content of the semiconductor layer (which may be amorphous prior to laser irradiation) should be reduced to below 5 at %, preferably below 3 at %. Thus, the method may further comprise heating the (amorphous) semiconductor layer at a temperature of 400-550° C. (e.g., about 500 C) for at least 1 hour, sufficient to reduce the hydrogen content of the doped (amorphous or at least partially polycrystalline) semiconductor layer or film to below 5 at %, preferably below 3 at %. Alternatively, hydrogen reduction and annealing may comprise irradiating with UV light from a conventional laser capable of delivering a number of low-power pulses (e.g., on the order of 1-100 ns) of radiation sufficient to reduce the hydrogen content to below 5 at % (preferably below 3 at %), then irradiating with a number of higher power UV light pulses (still generally on the order of 1-100 ns) sufficient to activate at least part of the dopant and (optionally) crystallize the doped semiconductor layer/film. In one implementation, the doped, oligomerized/polymerized silane film was cured at 500° C. for 15 hours to reduce the hydrogen content of the doped amorphous semiconductor film to below 3 at %.

Annealing by heating may be conducted at a temperature sufficiently low (e.g., 450-550° C.) and for a sufficient length of time (e.g., from 10 minutes to 24 hours) to activate the dopant, but not crystallize the amorphous film. This embodiment yields an electrically activated, doped, hydrogenated, amorphous semiconductor (e.g., Si) film.

Annealing by heating (e.g., rapid thermal annealing [RTA] or furnace annealing) may also be conducted at a temperature, for a length of time and/or at a temperature ramp (e.g., rate of change [increase and/or decrease]) sufficient to change the crystalline structure of the cured doped (and optionally, hydrogenated and/or amorphous) semiconductor layer (e.g., [re]crystallize it), in addition to activating some or all of the dopant. For silicon films, the annealing and/or crystallization temperature is typically at least 600° C., at least 650° C., at least 700° C., at least 750° C. or at least 800° C., for a minimum time of from 3, 6, 12 or 24 hours and/or up to a maximum time of 24, 36 or 48 hours. In one implementation, the RTA temperature is about 900° C. However, embodiments including Ge will crystallize at a significantly lower temperature. For example, over the course of a 24 hour period, a doped amorphous SiGe film having 30 at % Ge is expected to crystallize at a temperature of around 500-525° C., while a corresponding LPCVD Si film crystallizes at a temperature of around 600° C. Films containing mostly (or consisting essentially of) Ge may crystallize within temperature and time period ranges suitable for curing (e.g., 500-550° C. for 1-16 hours). Thus, the term "amorphous" in the phrase "doped, hydrogenated, amorphous semiconductor" is not intended to exclude doped, hydrogenated semiconductor films that may exhibit some or a substantial degree of (poly)crystallinity following the present curing step, prior to annealing (which may still be desired for dopant activation).

One may also induce crystallization (in addition to activating some or all of the dopant) using conventional metal-promoted (re)crystallization. Suitable metal-based crystallization promoters and processes for their use in crystallizing an amorphous semiconductor film (e.g., as formed from semiconductor nanoparticles containing Si and/or Ge) may be disclosed in copending application Ser. No. 10/339,741, filed Jan. 8, 2003, now U.S. Pat. No. 7,078,276, and entitled "Nanoparticles and Method for Making the Same", the relevant portions of which are incorporated herein by reference.

The present method of making a doped semiconducting film may further comprise, prior to curing, the step of irradiating a liquid phase composition comprising a doped silane on a substrate to form the crosslinked, oligomerized and/or polymerized doped silane. The method may also further comprise, prior to such irradiating, the step of depositing the liquid phase composition on the substrate (e.g., by coating or printing). Exemplary depositing techniques may include spin-coating (as discussed above), dip-coating, ink-jetting, spray-coating, etc., which may be adapted for simultaneous or near-simultaneous irradiation with UV light. However, in a preferred embodiment, the depositing step comprises spin coating.

As for the exemplary method(s) of making doped oligomerized/polymerized silane films described above, at least part of the irradiating step may be performed during at least part of the depositing step (e.g., the coating step and the irradiating step may be conducted simultaneously for some length of time). Thus, the irradiating step may be conducted for a length of time sufficient to (i) cross-link, isomerize, oligomerize and/or polymerize the doped silane, (ii) form a substantially uniform layer on the substrate, the substantially uniform layer comprising a doped oligo- and/or polysilane, and/or (iii) increase an average molecular weight, increase a viscosity and/or reduce a volatility of the liquid phase composition. In various embodiments, this length of time may be less than 1 second, at least 1 second, at least 3 seconds, at least 5 seconds, at least 10 seconds or at least 30 seconds. Generally, simultaneous deposition and irradiation causes the Group IVA atom and/or dopant source in the liquid phase composition to oligomerize and/or polymerize, typically by radiation-induced cross-linking, oligomerization and/or polymerization.

In this aspect of the present invention, the substrate may be as described above for the exemplary method(s) of making doped oligomerized/polymerized silane films. Also as for the exemplary method(s) described above, the liquid phase composition may consist essentially of components in the liquid phase at ambient temperatures.

As for the exemplary method(s) of coating a substrate with a doped oligomerized/polymerized silane film, the coating or printing, irradiating, heating, curing and annealing steps may be conducted under an inert and/or reducing gas, although the present doped films tend to be oxidation stable after curing at 400-500° C. Thus, the method may further comprise the steps of (i) purging an atmosphere in which the substrate is placed, then (ii) introducing the inert and/or reducing gas into the atmosphere, prior to the (1) coating or printing and (2) irradiating steps. Similarly, the irradiating step may be conducted for a length of time sufficient to (i) cross-link, isomerize, oligomerize and/or polymerize the doped silane, (ii) form a substantially uniform layer on the substrate, the layer comprising a doped oligo- and/or polysilane, and/or (iii) increase an average molecular weight, increase a viscosity and/or reduce a volatility of the composition.

In a typical implementation, the substrate having a doped oligomerized/polymerized silane film thereon (prepared as described above for the method of depositing a doped oligomerized/polymerized silane film onto a substrate) is placed onto a hotplate and heated for about 5-20 minutes at a temperature of from 80° C. to about 120° C. Thereafter, the substrate is placed into an oven for a time of from about 5-20 minutes up to about 10-15 hours at a temperature of about 350-550° C. under an inert gas flow (e.g., argon having <1 ppm $O_2$). This procedure yields a doped, hydrogenated, amorphous silicon film of ~10-120 nm thickness using the coating method and up to ~400 nm thickness using the patterning method, depending on the formulation of the doped silane composition.

Exemplary Doped Silane Compositions and Methods of Making the Same

The present invention further relates to a composition comprising (1) a Group IVA atom source, (2) a dopant source, and (optionally) a solvent in which the Group IVA atom source and dopant source are soluble. The Group IVA atom source generally consists of a Group IVA element (e.g., Si and/or Ge) and hydrogen (and/or isotopes thereof, such as deuterium). The dopant source generally (but not exclusively) consists essentially of one or more conventional semiconductor dopant atoms (e.g., B, P, As or Sb) that may have at least one substituent covalently bound thereto consisting essentially of a hydrocarbyl, silyl, germyl, or silagermyl group. Surprisingly, the presence of a carbon-containing substituent on the dopant atom does not result in a significant increase in the amount of carbon in doped semiconductor films formed from the present compositions, or in significant adverse effects on the electrical, physical and mechanical properties of such films, relative to undoped films formed from structurally analogous (cyclo)silane compounds.

Generally, the present composition is in the liquid phase at ambient temperatures (e.g., from about 15° C. to about 30°

C.). The present composition may be characterized as being at least one of the following types:

A novel hetero(cyclo)silane and a solvent;

A novel mixture of a silane compound and a dopant compound;

A novel hetero(cyclo)silane/solvent mixture; or

A novel silane compound/dopant compound/solvent mixture.

Each of these types of compositions is useful for making doped semiconductor films (e.g., by one or more of the exemplary methods described above), and thus, can provide a source of doped "liquid silicon." However, any liquid-phase composition (novel or not) that includes a Group IVA atom source and a dopant source may be useful in the exemplary methods described above. Each of the various types of the present doped "liquid silicon" compositions will be described in greater detail below, and suitable examples of each type of composition will be provided herein.

Exemplary Novel Hetero(Cyclo)Silane-Based Compositions

A variety of novel hetero(cyclo)silanes are contemplated by the present inventors for use in the present invention. For example, the hetero(cyclo)silane may comprise a heterocyclosilane compound of the formula $(AH_z)_n(DR^1)_m$, where n is from 2 to 12, m is 1 or 2, each of the n instances of A is independently Si or Ge, each of the n instances of z is independently 1 or 2, each of the m instances of D is Sb, As, P or B, and each of the m instances of $R^1$ is alkyl, aryl, aralkyl, or $AR^2_3$, where $R^2$ is hydrogen, alkyl, aryl, aralkyl, or $A_yH_{2y+1}$ (e.g., $1 \leq y \leq 4$). In certain preferred embodiments of this compound, A is Si, z is 2, n is (predominantly)$_4$, m is 1, and/or $R^1$ is $C_1$-$C_6$ alkyl (e.g., t-butyl), $C_6$-$C_{12}$ aryl (e.g., phenyl), $C_7$-$C_{12}$ aralkyl, $SiH_3$, or $Si(SiH_3)_3$, although other embodiments may be preferred under certain circumstances. Such heterocyclosilanes are described in copending application Ser. No. 10/950,373, filed Sep. 24, 2004 and entitled "Heterocyclic Semiconductor Precursor Compounds, Compositions Containing the Same, and Methods of Making Such Compounds and Compositions", the relevant portions of which are incorporated herein by reference to the extent possible.

Alternatively, the hetero(cyclo)silane may comprise a hetero-substituted (cyclo)silane compound of the formula $(A_nH_{z'})_m(DR^1_{3-m})_q$, where n is from 3 to 12, z' is from (n-q) to (2n+2-q), m is from 1 to 3, each of the n instances of A is independently Si or Ge, D is Sb, As, P or B, q is from 1 to n (preferably 1 or 2), and each of the (3-m) instances of $R^1$ is independently H, alkyl, aryl, aralkyl, or $AR^2_3$, where $R^2$ is hydrogen, alkyl, aryl, aralkyl, or $A_yH_{2y+1}$ (e.g., $1 \leq y \leq 4$). In certain preferred embodiments of this compound, A is Si, n is (predominantly)$_5$, $(A_nH_{z'})$ is monocyclic (i.e., z' is 2n−1), m and q are each 1, and/or $R^1$ is $C_1$-$C_6$ alkyl (e.g., t-butyl), $C_6$-$C_{12}$ aryl (e.g., phenyl), $C_7$-$C_{12}$ aralkyl, $SiH_3$, or $Si(SiH_3)_3$, although other embodiments may be preferred under certain circumstances. For example, in one embodiment, m is 1, and for each of the q instances of $DR'_2$, one $R^1$ may be H and the remaining instances selected from $C_1$-$C_6$ alkyl, $C_6$-$C_{12}$ aryl, $SiH_3$, and $Si(SiH_3)_3$.

Such hetero-substituted cyclosilanes in which m is 1 and q is from 1 to n are described in application Ser. No. 10/956,714, filed Oct. 1, 2004, now U.S. Pat. No. 7,674,926, and entitled "Dopant Group-Substituted Semiconductor Precursor Compounds, Compositions Containing the Same, and Methods of Making Such Compounds and Compositions", the relevant portions of which are incorporated herein by reference to the extent possible. Such hetero-substituted (cyclo)silanes in which m is 1, 2 or 3 may be prepared by alkali metal (e.g., Na or K)-induced cleavage of a Si—H bond in a (cyclo)silane of the formula $A_nH_{z'+1}$, followed by quenching with 1/x mole-equivalents of a heteroatom compound of the formula $DR^1_{3-x}X_x$, where X is a halogen (e.g., Cl) and x is 1, 2 or 3. Such hetero(cyclo)silanes and their preparation are also described in application Ser. No. 10/956,714, filed Oct. 1, 2004, now U.S. Pat. No. 7,674,926, and entitled "Dopant Group-Substituted Semiconductor Precursor Compounds, Compositions Containing the Same, and Methods of Making Such Compounds and Compositions", the relevant portions of which are incorporated herein by reference to the extent possible.

In an alternative embodiment, the present composition comprises a hetero-substituted silane compound of the formula $(AH_p)_n(DR^1_2)_2$, where n is from 3 to 12, each of the n instances of A is independently Si or Ge, each of the n instances of p is independently 1 or 2, D is Sb, As, P or B, and each $R^1$ is independently H, alkyl, aryl, aralkyl, or $AR^2_3$, where $R^2$ is hydrogen, alkyl, aryl, aralkyl, or $A_yH_{2y+1}$ (e.g., $1 \leq y \leq 4$). In certain preferred embodiments of this compound, A is Si, n is (predominantly)$_5$, p is 2, and $R^1$ is H, $C_1$-$C_6$ alkyl (e.g., t-butyl), $C_6$-$C_{12}$ aryl (e.g., phenyl), $C_7$-$C_{12}$ aralkyl, $SiH_3$, or $Si(SiH_3)_3$, although other embodiments may be preferred under certain circumstances. Such heterosilanes may be prepared by alkali metal (e.g., Li)-induced cleavage of a Si—Si bond in a cyclosilane of the formula $(AH_p)_n$, followed by quenching with 2 mole-equivalents of a heteroatom compound of the formula $DR^1_2X$, where X is a halogen (e.g., Cl). Such heterosilanes and their preparation are also described in application Ser. No. 10/956,714, filed Oct. 1, 2004, now U.S. Pat. No. 7,674,926, and entitled "Dopant Group-Substituted Semiconductor Precursor Compounds, Compositions Containing the Same, and Methods of Making Such Compounds and Compositions", the relevant portions of which are incorporated herein by reference to the extent possible.

Any of the compositions useful in the present invention (including these exemplary compositions based on novel hetero(cyclo)silanes) may further comprise a (cyclo)silane of the formula $A_xH_y$, where x is from 3 to 20, each A is independently Si or Ge, and y is from n to (2n+2). In general, the (cyclo)silane may comprise any compound consisting essentially of Group IVA atoms and hydrogen (and isotopes thereof, such as deuterium) that (i) is liquid or solid at ambient temperatures and (ii) can be cross-linked, isomerized, oligomerized and/or polymerized upon irradiating with an appropriate dose of radiation. However, in preferred embodiments, the (cyclo)silane comprises (or consists essentially of) a compound of the formula $(AH_z)_k$, where k is from 3 to 12 (more preferably from 4 to 6), each A is independently Si or Ge (more preferably Si), and each of the k instances of z is independently 1 or 2 (more preferably 2, in which case the cyclosilane is monocyclic). Representative (cyclo)silane compounds of the formula $A_xH_y$ and an exemplary method for their preparation are described in greater detail in application Ser. No. 10/789,317, filed Feb. 27, 2004, now U.S. Pat. No. 7,498,015, the relevant portions of which are incorporated herein by reference.

Alternatively, suitable (cyclo)silane compounds may be prepared in accordance with known methods (see, e.g., U.S. Pat. Nos. 4,554,180, 4,683,145, 4,820,788, 5,942,637 and 6,503,570; Kumada, J. Organomet. Chem., 100 (1975) 127-138; Ishikawa et al., Chem. Commun., (1969) 567; Hengge et al., J. Organomet. Chem., 212 (1981) 155-161; Hengge et al., Z. Anorg. Allg. Chem., 459 (1979) 123-130; and Hengge et al., Monatshefte für Chem., 106 (1975) 503-512, the relevant portions of which are incorporated herein by reference).

In various embodiments of the present composition, from about 1 to 99.999 vol %, from 0.5 to 90 vol %, or from 10 to 50 vol % of the composition consists essentially of the (cyclo) silane compound(s). Such compositions may contain proportions of (cyclo)silane compound and hetero(cyclo)silane sufficient to provide a desired doping level in the doped semiconductor film. For example, from 0.00001, 0.0001 or 0.001 to about 10, 20 or 50 vol % of the composition may consist essentially of the hetero(cyclo)silane, and from about 0.5, 1 or 10 to about 20, 50 or 99.9999 vol % of the composition may consist essentially of the (cyclo)silane compound. Alternatively, the hetero(cyclo)silane may be present in an amount providing from about 0.0001, 0.001 or 0.005 to about 1, 5 or 10 at. % of D atoms with respect to A atoms in the (cyclo)silane compound.

Any of the compositions useful in the present invention (including these exemplary compositions based on novel hetero(cyclo)silanes) may further comprise a solvent in which the silane and/or dopant are soluble. The solvent in the present composition is one that is generally easily and/or thoroughly removable from the composition. Thus, apolar and/or nonpolar solvents (e.g., saturated hydrocarbons such as $C_5$-$C_{12}$ alkanes, aliphatic ethers such as di-$C_2$-$C_6$ alkyl ethers, methyl $C_4$-$C_6$ alkyl ethers and di-$C_1$-$C_4$ alkyl $C_2$-$C_6$ alkylene diethers [e.g., glyme], cyclic ethers such as tetrahydrofuran and dioxane, (cyclo)siloxanes, arenes such as benzene, toluene and xylenes, etc.) may be included in compositions suitable for use in the present methods of forming a doped, oligomerized/polymerized silane film (e.g., coating a substrate with a doped, oligomerized/polymerized silane film and/or printing a doped, oligomerized/polymerized silane film in a pattern on a substrate). Preferably, the solvent is a $C_5$-$C_{12}$ mono- or bicycloalkane (e.g., cyclohexane, cycloheptane, cyclooctane, decalin, etc.).

The higher the volume percentage (or mass loading) of silane compounds in an ink composition that includes a solvent, the thicker the film. For example, a silane ink composition containing about 20 vol % of silanes generally forms a film having a thickness of about 100 nm using the exemplary film-forming process described in copending U.S. application Ser. No. 10/789,274, filed Feb. 27, 2004. Similarly, an ink composition containing about 5 vol % of silanes generally forms a film having a thickness of about 20 nm using the same exemplary film-forming process.

The composition may further comprise one or more conventional additives, such as a surface tension reducing agent, a surfactant, a binder and/or a thickening agent, in conventional amount(s). However, such additives are not at all necessary. As a result, the present composition may consist essentially of one or more hetero(cyclo)silane compounds, one or more (cyclo)silane compounds, and a solvent. Alternatively, as discussed above, the present composition may consist essentially of the hetero(cyclo)silane and (cyclo)silane compounds, without the addition of a solvent.

Exemplary Compositions Based on Novel Mixtures of (Cyclo)Silanes and Dopant Compounds In a further embodiment, the present doped "liquid silicon" composition may comprise (1) a compound of the formula $A_xH_y$, where each A is independently Si or Ge, x is from 3 to 20, and y is from x to (2x+2); and (2) a dopant of the formula $D_aR^1_b$, where D is Sb, As, P or B; a is from 1 to 20; each of the b instances of $R^1$ is independently H, alkyl, aryl, aralkyl or $AR^2_3$, where $R^2$ is hydrogen, alkyl, aryl, aralkyl or $A_yH_{2y+1}$ (e.g., where $1 \leq y \leq 4$, such as $SiH_3$ and $Si(SiH_3)_3$), and at least one of the b instances of $R^1$ is alkyl, aryl, aralkyl or $AR^2_3$; and b is an integer corresponding to the number of binding sites available on the a instances of D. Alternatively, the present doped "liquid silicon" composition may comprise (I) the compound of the formula $A_xH_y$, and (II) a dopant of the formula $(R^2_3A)_rA_c(DR^1_2)_s$, where c is 1 to 4, r+s=2c+2, s≥1 (preferably s≥3), and $R^1$ and $R^2$ are as described for $D_aR^1_b$. In either case, the composition may further comprise (i) a solvent in which the compound and the dopant are soluble, and/or (ii) one or more hetero(cyclo)silane compounds as described above.

In one embodiment, the dopant has the formula $D_{a'}R^1_{b'}$, where a' is 1 or 2; b' is 3a', at least a' instances of $R^1$ are $C_1$-$C_6$ alkyl, $C_6$-$C_{10}$ aryl, $C_7$-$C_{10}$ aralkyl or $AR^2_3$ (preferably $AR^2_3$), where $R^2$ is hydrogen or $A_yH_{2y+1}$ ($1 \leq y \leq 4$; preferably y=1), and the remainder of the b' instances of $R^1$ are independently H, $C_1$-$C_6$ alkyl, $C_6$-$C_{10}$ aryl, $C_7$-$C_{10}$ aralkyl or $AR^2_3$. In various implementations, the dopant has the formula $D(AH_3)_3$, wherein D is P or B, and/or A is Si.

In another embodiment, the dopant has the formula $(R^2_3A)_rA_c(DR^1_2)_s$, where D is Sb, As, P or B; c is from 1 to 4 (preferably 1); r+s=2c+2; s≥1 (preferably s≥3); and each of $R^1$ and $R^2$ are as described above. Alternatively, the dopant may have the formula $A_cR^3_r(DR^1_2)_s$, where each A is independently Si or Ge; D is Sb, As, P or B; c is 1 to 4 (e.g., 1 or 2); r+s=2c+2; s≥1 (preferably s≥3); each of the r instances of $R^3$ is independently H, $DR^1_2$ or $AR^2_3$; and each of the 2s instances of $R^1$ is independently H, alkyl, aryl, aralkyl or $AR^2_3$, where $R^2$ is hydrogen, alkyl, aryl, aralkyl or $A_yH_{2y+1}$ (e.g., where $1 \leq y \leq 4$, such as $SiH_3$ and $Si(SiH_3)_3$)). For example, the dopant may have the formula $(Me_3Si)Si(PH_2)_3$ or $(Me_3Si)_3SiPH_2$, where Me is a methyl group. Preferably, $R^1$ is H, $C_1$-$C_6$ alkyl, $C_6$-$C_{10}$ aryl, or $AR^2_3$, and $R^2$ is hydrogen or $A_yH_{2y+1}$ ($1 \leq y \leq 4$). In certain embodiments, the dopant has the formula $A_c(DR^1_2)_{2c+2}$, $R^1$ is H, t-butyl, phenyl, or $AH_3$ (preferably H or $AH_3$), D is P or B, and/or A is Si (e.g., $Si(PH_2)_4$, $Si(P[t-Bu]_2)_4$, or $Si(P[SiH_3]_2)_4$).

Such compositions may contain suitable proportions of (cyclo)silane compound and dopant to provide a desired doping level in the doped semiconductor film. For example, from 0.00001, 0.0001 or 0.001 to about 10, 20 or 50 vol % of the composition may consist essentially of the dopant and from about 0.5, 1 or 10 to about 20, 50 or 99.9999 vol % of the composition may consist essentially of the compound. Alternatively, the dopant may be present in an amount providing from about 0.0001, 0.001 or 0.005 to about 1, 5 or 10 at. % of D atoms with respect to A atoms in the (cyclo)silane compound.

Furthermore, the composition may further comprise a solvent (e.g., as discussed above). In certain embodiments, the solvent is selected from the group consisting of alkanes, substituted alkanes (e.g., with from 1 to 2n+2 [preferably 1 or 2] of the substituents described above), cycloalkanes, substituted cycloalkanes (e.g., with 1 or 2 of the substituents described above), arenes, substituted arenes (e.g., with from 1 to 6 [preferably 1 or 2] of the substituents described above), and (cyclic) siloxanes. As for the other exemplary compositions described herein, "cycloalkanes" refers to both mono- and polycycloalkanes, and examples of suitable cycloalkane solvents for the present composition include $C_5$-$C_{12}$ mono- or bicycloalkanes (e.g., cyclohexane, cycloheptane, cyclooctane, decalin, etc.).

Exemplary Compositions Based on Novel Mixtures of Hetero(Cyclo)Silane Compounds and Solvents A still further aspect of the present invention relates to a doped hetero(cyclo)silane composition comprising (1) a compound of the formula $A_xH_yD_z$, where each A is independently Si or Ge, x' is from 3 to 20, y' is from x to (2x+z+2), D is Sb, As, P or B, and z is from 1 to 4; and (2) a solvent selected from the group consisting of cycloalkanes, substituted cycloalkanes, fluoroalkanes, and (cyclic) siloxanes. The (cyclic) siloxane solvents are generally those that are liquid at ambient temperatures (e.g., 15-30° C.). Preferably, the compound of the formula $A_xH_{y'}D_z$ is cyclic, x' is from 3 to 12, y' is from x to (2x+z), and/or z is 1 or 2. In certain embodiments, the compound of the formula $A_xH_yD_z$ is monocyclic, x' is from 4 to 6, y' is (2x+z), and z is 1. As for other preferred embodiments described above, D may be P or B, and A may be Si. Such compounds are known, and exemplary processes for their preparation are described in U.S. Pat. Nos. 4,683,145 and 6,527,847, and U.S. Patent Publication No. 2003/0229190.

The composition may contain from 0.00001 to 50 vol %, from 0.001 to 35 vol %, or from about 0.01 to 25 vol % of the compound. Viewed a little differently, from 0.00001 to 50 vol %, from 0.001 to 35 vol %, or from about 0.01 to 25 vol % of the composition may consist essentially of the compound.

The exemplary hetero(cyclo)silane/solvent composition herein has novelty and/or particular advantage in the present invention as a result of the selection of solvent. For example, when the solvent is a mono- or bicycloalkane, the solvent is relatively easily and/or completely removed from the composition in the process of film formation. Perhaps more importantly, the solubility and stability of (doped) silanes tends to be higher in mono- or bicycloalkane than in arene-based solvents. Thus, cycloalkanes, (cyclic) siloxanes and fluoroalkanes are preferred in the novel mixtures for their removability from the coated and/or printed composition.

In various embodiments, the solvent is selected from the group consisting of $C_6$-$C_{12}$ monocycloalkanes; $C_3$-$C_8$ monocycloalkanes substituted with from 1 to 2n $C_1$-$C_4$ alkyl or halogen substituents or from 1 to n $C_1$-$C_4$ alkoxy substituents, where n is the number of carbon atoms in the monocycloalkane ring; $C_{10}$-$C_{14}$ polycycloalkanes; siloxanes of the formula $(R^3{}_3Si)(OSiR^3{}_2)_p(OSiR^3{}_3)$, where p is from 0 to 4, and each $R^3$ is independently H, $C_1$-$C_6$ alkyl, benzyl or phenyl substituted with from 0 to 3 $C_1$-$C_4$ alkyl groups; cyclosiloxanes of the formula $(SiR^4{}_2O)_q$, where q is from 2 to 6, and each $R^4$ is independently H, $C_1$-$C_6$ alkyl, benzyl or phenyl substituted with from 0 to 3 $C_1$-$C_4$ alkyl groups; and $C_3$-$C_8$ fluoroalkanes substituted with from 1 to (2n+2) fluorine atoms, where n is the number of carbon atoms in the selected solvent. Preferably, the solvent is a $C_5$-$C_{10}$ monocycloalkane (e.g., cyclooctane) or a $C_{10}$-$C_{14}$ polycycloalkane (e.g., decalin).

Exemplary Compositions Based on Novel Mixtures of (Cyclo)Silane Compounds, Dopants and Solvents A still further aspect of the present invention relates to a doped liquid silane composition comprising (A) a compound of the formula $A_xH_y$, as described above; (B) a dopant of the formula $D_aH_b$, where D is Sb, As, P or B, a is from 1 to 20, and b is from 0 to 26; and (C) a solvent selected from the group consisting of cycloalkanes, substituted cycloalkanes, fluoroalkanes, and (cyclic) siloxanes. The solvent is generally one of those described for the exemplary hetero(cyclo)silane/solvent composition described above. The dopant may be an elemental substance (e.g., red or yellow phosphorous), a known borane, or phosphine or arsine. Examples of suitable boranes include $B_2H_6$, $B_5H_9$, $B_6H_{10}$, $B_6H_{12}$, $B_9H_{15}$, $B_{10}H_{14}$, $B_{10}H_{16}$, $B_{13}H_{19}$, $B_{16}H_{20}$, and $B_{20}H_{26}$.

Exemplary Methods of Making Doped Silane Compositions

The invention further relates to a method of making the present composition. This method generally comprises the steps of: combining the silane compound with the dopant and/or solvent, and mixing the silane compound and the dopant and/or solvent to form the composition. Somewhat surprisingly, mono- and polycycloalkanes (e.g., monocyclooctane, decalin) provide ink formulations with improved stability relative to aromatic hydrocarbons.

In one implementation, the composition may be prepared by mixing about 10-25 vol. % of one or more (doped) silane compounds (which may have >90% purity, ≧95% purity, or ≧98% purity in combination with other cyclic, linear or branched silanes) with a dopant and/or a solvent under an inert (e.g., argon) atmosphere. The mixture is stored in amber vials (to prevent UV or other radiation exposure) at ambient temperatures or lower. This composition consisting of liquid-phase components may be used directly in the present methods of coating or printing a thin doped, oligomerized/polymerized silane film on a substrate and/or of forming a doped amorphous or polycrystalline semiconductor thin film, as described above.

Exemplary Semiconducting Thin Films and Devices

The present invention further relates to a semiconducting thin film structure comprising a substantially uniform layer of doped semiconducting material on a substrate, the doped semiconducting material comprising (a) a hydrogenated, amorphous or at least partially polycrystalline Group IVA element, the Group IVA element comprising at least one of silicon and germanium, and (b) a dopant. In certain embodiments, the Group IVA element in the thin film structure comprises or consists essentially of silicon, and the dopant (which may be B, P, As or Sb, but which is preferably B or P) may have a concentration of from about $10^{16}$ to about $10^{21}$ atoms/cm$^3$. Notably, the concentration profile of the dopant in the thin film does not vary significantly throughout the substantial thickness or depth of the film (see, for example, FIG. 1 and the corresponding description thereof below).

The doped semiconducting thin film structure may have a thickness of from 0.005 μm to 1000 μm (preferably from 0.01 μm to 200 μm, more preferably from 0.01 μm to 100 μm). The films prepared by the present method(s) and/or from the present composition(s) generally show (i) greater adhesion, uniformity (e.g., in thickness or morphology) and/or (ii) carrier mobility, and/or (iii) reduced carbon content, relative to films made by an otherwise identical process (a) in which coating and irradiation were not performed simultaneously (i.e., in discrete steps), (b) in which irradiation of the composition comprising a doped silane was performed only prior to deposition, and/or (c) from an otherwise identical composition including an arene solvent (when the present composition includes only a cycloalkane solvent). Furthermore, such films do not contain significantly greater amounts of carbon relative to undoped films formed from structurally analogous cyclosilanes (e.g., cyclopentasilane).

The present invention also concerns a device such as a thin film capacitor, diode (e.g., a Schottky diode, Zener diode, photodiode, etc.), resistor or thin film transistor, comprising the present doped semiconductor thin film, a device terminal layer above or below the doped semiconductor thin film, and one or more metallization structures in contact with the doped semiconductor thin film. In one embodiment, the thin film transistor comprises a bottom-gate transistor that includes a transistor terminal layer below the doped semiconductor thin film. In such an embodiment, the substrate contains the transistor gate, and the doped semiconductor thin film contains the transistor sources and drains. Alternatively, the transistor terminal layer may be above the doped semiconductor thin film, in which case the transistor terminal layer comprises a gate layer, and the doped semiconductor thin film comprises a source/drain terminal layer. The transistor terminal layer may comprise a conventional semiconducting material, a conventional conducting material, or a laminate of two or more conventional semiconducting and/or conducting materials (e.g., heavily doped silicon with a transition metal silicide, such as nickel silicide, titanium silicide or tungsten silicide, thereon). In either case, the metallization structures in the thin film transistor may comprise a contact structure in physical and/or electrical contact with the source and drain structures of the source/drain terminal layer (and optionally, in physical and/or electrical contact with the gate of the transistor terminal layer).

In another embodiment, the device comprises a thin film capacitor, such as a MOS capacitor. In one implementation, the capacitor comprises a lower metal layer, such as Al, under an oxide layer, such as $Al_2O_3$, on which a semiconductor (e.g., doped amorphous Si or polysilicon) layer may be formed (e.g., in accordance with the present invention). Generally, an upper metal layer (e.g., of Al, an Al alloy, Ni or Ag) is then formed on the doped semiconductor layer. In another embodiment, the semiconductor layer comprises (i) a lower undoped or slightly doped amorphous silicon or polysilicon layer and (ii) an upper heavily doped amorphous silicon or polysilicon layer. Generally the upper, more heavily doped silicon layer is thinner than the bottom, less doped or undoped, silicon layer. Alternatively, the capacitor layers may be reversed (e.g., upper metal on oxide on doped silicon on lower metal). Zener diodes may be made by a similar process, in which a plurality of (doped) semiconductor layers having different dopant types (e.g., p, n or i) and/or concentration levels may be formed sequentially, one on another, as is known in the art. Schottky diodes may also be made by a similar process, in which one or more (doped) semiconductor layers and a metal layer are formed in contact with one another (e.g., in a stacked or laminate-type structure) so to form a metal-semiconductor junction, as is known in the art. Photodiodes comprising the present doped semiconductor film may also be formed in accordance with the description(s) herein and with techniques known in the art, such that a photoconductive or photosensitive material (e.g., the present doped semiconductor film) may be configured to receive light and provide variable (but predictable and/or predetermined) electrical properties and/or functions in response to such light.

The invention further relates to a method of making a device such as a capacitor and/or transistor, comprising at least one of the present methods of (i) coating or printing a doped oligomerized/polymerized silane film on a substrate and (ii) making a doped semiconductor thin film, and forming a metallization structure in electrical communication with the doped film. The metallization structure may be formed by conventional metal deposition (e.g., by conventional sputtering or evaporation) and photolithography, by printing and/or deposition techniques using metallic inks, by conventionally dispensing commercial metal pastes, by conventional electro- or electroless plating, or alternatively, by laser patterning techniques to yield metal source/drain (and optionally, gate) contacts. The method may further comprise conventionally growing or depositing an oxide and/or nitride (e.g., silicon oxide, silicon nitride) on the substrate (e.g., a conventional single-crystal silicon wafer).

Conventional isolation processes, such as "island isolation" techniques that involve masking of the silicon layer, optional etching, and either thermal growth or deposition of silicon dioxide, may be employed to isolate TFTs from each other. However, island isolation may not be necessary if dopant activation was achieved by laser irradiation through a mask or in a pattern, leaving non-irradiated, electrically inactive cured semiconductor layer portions between the laser irradiated, activated semiconductor film portions. Typical channel lengths may be from 3 to 50 microns, and typical channel widths may be from 10 to 1000 microns. The metal contacts may be annealed for a length of time and at a temperature sufficient to enhance bonding and/or improve the electrical contact of the metal to the thin film, and/or improve device performance (e.g., from 1 to 120 minutes, 10 to 90 minutes, or 15 to 60 minutes, at 200-500° C., 250-400° C. or 300-350° C.) under an inert atmosphere (e.g., argon, nitrogen, nitrogen/hydrogen or argon/hydrogen). Conventional metallization ("back-end"), assembly and packaging processing may then be employed to complete the finished devices/products.

An exemplary thin film transistor (TFT) may be made as follows. A silicon wafer (which may be, and preferably is, [heavily] doped with a conventional n- or p-type dopant, more preferably heavily doped) has an oxide layer grown thereon by a conventional wet or dry method. In various embodiments, the oxide layer has a thickness of from 20 to 200 nm, from 30 to 150 nm, or from 50 to 125 nm. A doped, oligomerized/polymerized silane film is deposited thereon as described above, and the doped, oligomerized/polymerized silane film may be cured and (optionally) annealed as described above with regard to the exemplary methods of forming thin doped semiconductor films to form a substantially uniform doped silicon film. The resulting film stack can be further processed after curing and (optionally) annealing the doped semiconductor film by conventional metal deposition/photolithography to yield a bottom-gate TFT structure with metal source/drain contacts, where the silicon wafer may act as the gate. The metal for the source/drain contacts (as well as for any subsequent metallization layers) can be aluminum, conventional alloys of aluminum with copper and/or silicon, copper (which can be formed by conventional techniques for making copper metallization in an integrated circuit or a printed circuit board), nickel, silver, gold, etc. A TFT formed in accordance with the present method may have mobilities of up to 100 or up to 10 $cm^2/Vs$ if it includes polysilicon, but otherwise, generally up to 1.0, 0.5, 0.25, 0.20, 0.15 or 0.12 $cm^2/Vs$ and on/off ratios greater than about $10^3$, about $10^4$, about $10^5$, or about $10^6$.

EXAMPLES

Synthesis of Cyclo(Phenylphospha)Tetrasilane

In a 1 L 4-neck flask equipped with addition funnels, a thermometer and a gas dispersion tube, 10 g of nonaphenyl-cyclophosphatetrasilane obtained as described in copending U.S. application Ser. No. 10/950,373 ("Heterocyclic Semiconductor Precursor Compounds, Compositions Containing the Same, and Methods of Making Such Compounds and Compositions" and filed concurrently herewith, the relevant portions of which are incorporated herein by reference) and 0.3 g freshly sublimed $AlCl_3$ are suspended in 200 ml of dry toluene. Under vigorous stirring, dry HCl gas is bubbled through this suspension at ambient temperature until an almost colorless to yellow solution is obtained. Under continuous HCl bubbling, the solution is stirred for 5-8 hrs.

50 mL of a 1M ethereal solution of $LiAlH_4$ (Aldrich) is added under vigorous stirring to the toluene solution at 0° C. The resulting suspension is further stirred at room temperature for another 15 hrs after the addition. Two phases are formed upon removing 150 ml solvent under reduced pressure. The lower phase containing precipitated byproduct is removed with a reparatory funnel to yield about 125 ml of a clear solution. The solvents are further removed under reduced pressure. The product is purified by re-condensation to afford 0.5 ml clear colorless liquid (yield: 40%).

$^1$H-NMR, $^{29}$Si-NMR, $^{31}$P-NMR and GC/MS analysis of the liquid confirm that a mixture of heterocyclosilanes has been formed with cyclo(phenylphospha)tetrasilane as the main component. Cyclopentasilane can be identified as a second component. Other silane species are formed as well as aromatic and aliphatic byproducts.

Procedure for Forming a P-Doped Silane Film

A spin coater coupled with a 6 inch square low-pressure mercury UV grid lamp (designed and built in accordance with the disclosure of copending U.S. application Ser. No. 10/789,274, filed Feb. 27, 2004) was placed into an inert atmosphere glove box, largely to prevent silane oxidation during deposition and curing.

A P-doped silane ink was prepared by mixing cyclo(phenylphospha)tetrasilane (c-[SiH$_2$]$_4$P-Ph) with a volume of cyclooctane sufficient to provide an ink containing ~20 vol % of cyclo(phenylphospha)tetrasilane. The resulting P-doped silane ink was stored in a refrigerator in silanized amber vials to prevent inadvertent decomposition due to UV exposure or hydroxylation (e.g., from latent —OH groups on the surface of the glass vial).

A substrate (e.g., a 100 mm silicon wafer, n$^+$-type, 0.01 Ohm cm resistivity, with 100 nm dry oxide thermally grown thereon) is placed onto the vacuum chuck of the spin-coater. About 0.3 ml of the P-doped silane ink is dispensed onto the substrate from a syringe equipped with a 0.2 micron PTFE syringe filter while slowly rotating the substrate and moving the syringe tip from the center to the edge of the substrate. After dispensing, UV spin-coating is started by accelerating the substrate with the liquid silane thereon to 500 rpm for 5 seconds, then to 3000 rpm for an additional 30 sec. Three seconds after the acceleration is initiated, the UV lamp is turned on for a total of about 32 seconds. The power output of the UV lamp is about 0.1-0.3 mW/cm$^2$ at the location of the substrate and silane film. This procedure generally yields a polymerized, hydrogenated doped silane film covering more than 90% of the substrate.

Procedure for Forming a Thin Doped Amorphous Silicon Film

The substrate having a silane film formed thereon from a cyclo(phenylphospha)-tetrasilane ink as described above is placed onto a hotplate and heated for about 10 minutes to 100° C. in an inert atmosphere (argon or nitrogen), then it is placed for about 20 minutes into an oven at a temperature of about 400° C. under inert gas flow (e.g., argon having <1 ppm O$_2$). This procedure yielded a hydrogenated, n-doped amorphous silicon film of ~100 nm thickness.

Recrystallization of a Doped Thin Silicon Film

The n-doped amorphous silicon film formed from a cyclo(phenylphospha)-tetrasilane ink as described above is recrystallized to form a doped polycrystalline silicon film using a KrF (248 nm) excimer laser with a pulse width of 38 ns (10 pulses at 180 mJ/cm$^2$ fluence in an N$_2$ purged environment). As an alternative to laser treatment, a film formed by the same UV-spincoating process described above is annealed by RTA or furnace annealing at 900° C. under 200 sccm N$_2$ flow to obtain essentially the same polycrystalline film. Both laser treatment and annealing (RTA) of the doped, hydrogenated silicon film are believed to electrically activate the P dopant in the film.

P-Doped Silicon Film Characterization

The dopant concentration in the recrystallized film formed from a cyclo(phenyl-phospha)tetrasilane ink is measured using Secondary Ion Mass Spectrometry (SIMS). As shown in FIG. 1, the phosphorus concentration in the polycrystalline film is typically from about $10^{20}$ to about $5 \times 10^{20}$ atoms/cm$^3$ (0.2-1 at. %), and phosphorus is uniformly distributed throughout the entire film.

A standard four-point Kelvin Resistor measurement is taken to measure the electrical effect of the dopant on the film. The median sheet resistance of the film is in the range of from 1750 to 5000 $\Omega$cm$^{-2}$.

Doped Silane Inks Using Organophosphines as Dopant Precursors

Doped silicon films were made from an ink containing a cyclosilane (20 vol % of a cyclosilane mixture containing primarily c-Si$_5$H$_{10}$ in cyclooctane) with an organophosphine compound as dopant. The amount of the phosphine compound was chosen such that the ratio of Si- to P-atoms in the ink was 10:1. The ink was UV-spincoated as described above on Si wafers having ~100 nm thermal oxide thereon to form doped oligomerized/polymerized silane films. The doped oligomerized/polymerized silane films were cured using the curing conditions described above for forming a thin doped amorphous silicon film. After curing at 400-500° C. in inert atmosphere, however, the films are still highly resistive, indicating that the dopant is not activated.

Dopant activation is achieved by heating the films in a rapid thermal annealing (RTA) furnace for 1 min. at 900° C. in a nitrogen atmosphere. The results for films obtained in this manner are shown in Table 1 below for representative organophosphines such as tert-butyl phosphine, di-(tert-butyl) phosphine and tri-(tert-butyl) phosphine. Other organophosphines may be used, and have demonstrated similar results.

TABLE 1

Properties of doped silicon films formed from cyclosilane-organophosphine inks.

| Dopant | Film Thickness [nm] | Doping Level [$10^{20}$ at/cm$^3$] | Resistivity [$\Omega$ cm] |
|---|---|---|---|
| tert-butylphosphine t-BuPH$_2$ | 60 | 1.2 | 0.015 |
| di-(t-butyl)phosphine (t-Bu)$_2$PH | 44 | 1 | 0.027 |
| tri-(t-butyl)phosphine (t-Bu)$_3$P | 87 | 1.4 | 0.014 |

Figure 2:
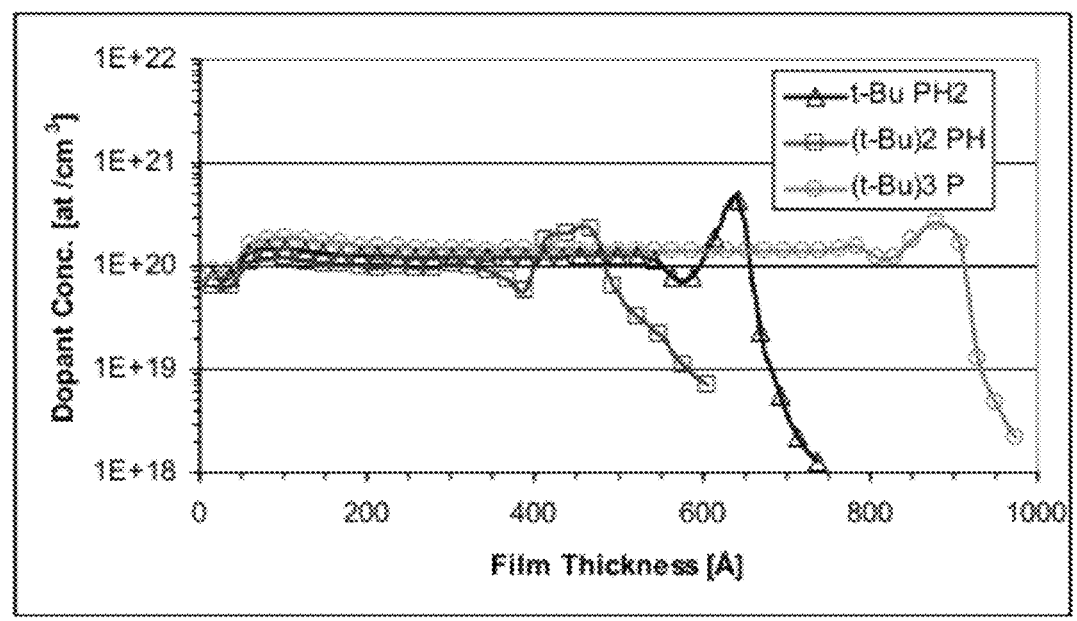
FIG. 2 is a graph showing the dopant concentration/distribution as a function of film depth/thickness in a series of second exemplary thin films made in accordance with the present invention.

Characterization of P-Doped Silicon Films from Organophosphine-Doped Silane Inks A uniform dopant distribution in these films is evident from the SIMS profiles for phosphorous atoms, as shown in FIG. 2. Dopant concentrations around $1*10^{20}$ at/cm$^3$ and film resistivities around 0.01-0.03 ~cm have been realized. Higher and/or lower dopant concentrations and conductivities can be accomplished by changing the ratio of silicon to dopant atoms in the ink.

Similar results are obtained by crystallizing and activating the doped amorphous Si films by laser-induced crystallization, furnace thermal annealing and metal-induced crystallization.

Ohmic Contact of Doped Silicon Films to Metallization

Figure 3:
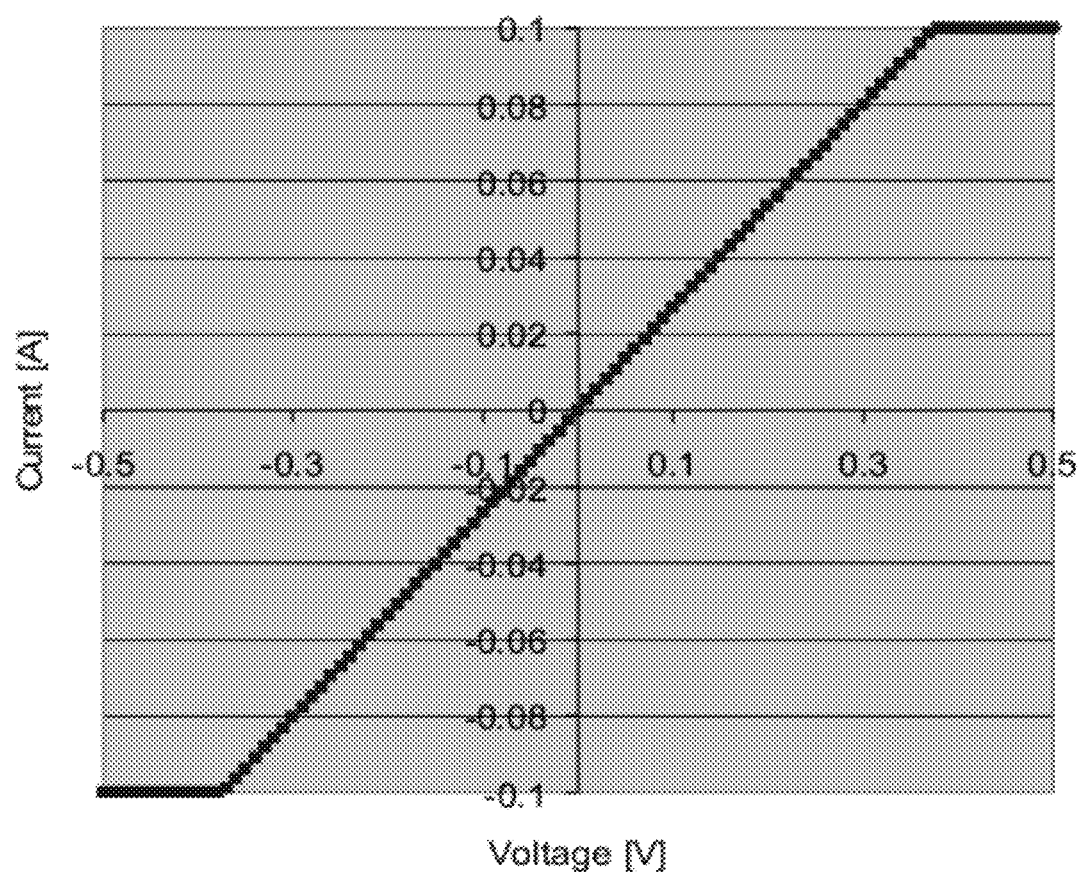
FIG. 3 is a graph showing a conventional current as a function of applied voltage (I-V) curve for a thin film made in accordance with the present invention (see the "Ohmic Contact" example described in paragraph [0097] below).

The contact resistance of doped silicon layers to Al metal was determined by spincoating, curing and RTA activating a doped silicon film formed from a silicon ink doped with di-(tert-butyl)phosphine (Si:P ratio=10:1) on a N$^+$ Si wafer as described above. After activation, 200 square microns of Aluminum were shadow evaporated onto the film, and the silane was RIE etched in the exposed areas (i.e., those areas of the doped silane film not having Al evaporated onto it). I-V curves of this vertical stack were measured with the wafer at a potential of 0 V. The resulting I-V curve demonstrating an Ohmic contact between the doped silicon and the Al metal is shown in FIG. 3. A contact resistance of <0.002 Ohm/cm$^2$ can be determined from the data in FIG. 3.

CONCLUSION/SUMMARY

Thus, the present invention provides doped semiconductor thin film structures, methods of forming doped oligomerized/polymerized silane and/or semiconductor thin films, and doped liquid phase silane compositions useful in such methods. The present semiconductor thin films may have a dopant concentration of from about $10^{16}$ to about $10^{21}$ atoms/cm$^3$ that does not vary significantly throughout the substantial thickness or depth of the film. The present composition is generally liquid at ambient temperatures and includes a Group IVA atom source and a dopant source, thus providing a doped "liquid silicon" composition.

By irradiating a doped liquid silane while coating, a thin, substantially uniform doped silane film may be formed onto a substrate. Such irradiation is believed to convert the doped silane film into a relatively high-molecular weight species with relatively high viscosity and relatively low volatility, typically by cross-linking, isomerization, oligomerization and/or polymerization. A film formed by the irradiation of doped liquid silanes can later be converted (generally by heating and, optionally, irradiating) into an at least partially amorphous, hydrogenated doped silicon film or a doped polysilicon film suitable for electronic devices. Thus, the present invention enables use of high throughput, low cost equipment and techniques for making semiconductor films of commercial quality and quantity from doped "liquid silicon."

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A composition, comprising:
  a) a compound of the formula $A_xH_y$, where each A is independently Si or Ge, x is from 3 to 20, and y is from x to (2x+2); and
  b) at least one dopant of the formula $B_aR^1{}_b$ and/or $(R^2{}_3A)_rA_c(BR^1{}_2)_s$, where a is 1 or 2; b is 3a; each $R^1$ is independently H, $C_2$-$C_6$ alkyl, aralkyl, aryl, or $AR^2{}_3$, at least a of the b and each of the 2s instances of $R^1$ is hydrocarbyl having at least 3 carbon atoms, and when at least one of the b instances of $R^1$ in the formula $B_aR^1{}_b$ is t-butyl or phenyl, at least 1 of the remaining instances of $R^1$ in the formula $B_aR^1{}_b$ is H, aralkyl, or $AR^2{}_3$; $R^2$ is hydrogen, aryl, or $A_zH_{2z+1}$; z is 1 to 4; c is 1 to 4, r+s=2c+2, and s≧1.

2. The composition of claim 1, wherein said compound has the formula $(AH_x)_k$, where k is from 3 to 12, and each of the k instances of x is 1 or 2.

3. The composition of claim 2, wherein said compound is monocyclic, k is from 4 to 8, and x is 2.

4. The composition of claim 1, wherein A is Si.

5. The composition of claim 4, wherein said dopant has the formula $B_aR^1{}_b$, where at least a instances of $R^1$ are $C_3$-$C_6$ alkyl or $C_6$-$C_{10}$ aryl, and the remainder of the b instances of $R^1$ are independently H, $C_2$-$C_6$ alkyl, $C_6$-$C_{10}$ aryl, $C_7$-$C_{10}$ aralkyl or $AR^2{}_3$, where $R^2$ is hydrogen or $A_zH_{2z+1}$ (1≦z≦4).

6. The composition of claim 5, wherein all of the instances of $R^1$ are $C_3$-$C_6$ alkyl.

7. The composition of claim 6, wherein all of the instances of $R^1$ are propyl and/or butyl.

8. The composition of claim 1, wherein the at least one dopant has the formula $B_aR^1{}_b$, at least a instances of $R^1$ are $C_3$-$C_6$ alkyl or $C_6$-$C_{10}$ aryl, and the remainder of the b instances of $R^1$ are H, $C_2$-$C_6$ alkyl, $C_6$-$C_{10}$ aryl, or $AR^2{}_3$, where $R^2$ is hydrogen or $A_zH_{2z+1}$ (1≦z≦4).

9. The composition of claim 8, wherein the at least one dopant has the formula $BR^1{}_3$, at least one instance of $R^1$ is $C_3$-$C_6$ alkyl, and the remainder of the instances of $R^1$ are $C_3$-$C_6$ alkyl, phenyl, or $AH_3$.

10. The composition of claim 1, wherein from 0.00001 to 50 vol % of said composition consists essentially of said dopant and from 0.5 to 99.999 vol % of said composition consists essentially of said compound.

11. The composition of claim 10, further comprising a solvent in which said compound and said dopant are soluble.

12. The composition of claim 11, wherein said solvent is selected from the group consisting of alkanes, substituted alkanes, cycloalkanes, substituted cycloalkanes, arenes, substituted arenes, and (cyclic) siloxanes.

13. The composition of claim 12, wherein said solvent is selected from the group consisting of $C_5$-$C_{10}$ monocycloalkanes; $C_3$-$C_8$ monocycloalkanes substituted with from 1 to 2n $C_1$-$C_4$ alkyl or halogen substituents or from 1 to n $C_1$-$C_4$ alkoxy substituents; $C_{10}$-$C_{14}$ polycycloalkanes; siloxanes of the formula $(R^3{}_3Si)(OSiR^3{}_2)_p(OSiR^3{}_3)$, where p is from 0 to 4, and each $R^3$ is independently H, $C_1$-$C_6$ alkyl, benzyl or phenyl substituted with from 0 to 3 $C_1$-$C_4$ alkyl groups; cyclosiloxanes of the formula $(SiR^4{}_2O)_q$, where q is from 2 to 6, and each $R^4$ is independently H, $C_1$-$C_6$ alkyl, benzyl or phenyl substituted with from 0 to 3 $C_1$-$C_4$ alkyl groups; and $C_3$-$C_8$ fluoroalkanes substituted with from 1 to (2n+2) fluorine atoms, where n is the number of carbon atoms in the selected solvent.

14. The composition of claim 13, wherein said solvent is a $C_6$-$C_{10}$ monocycloalkane or a $C_{10}$-$C_{14}$ polycycloalkane.

15. The composition of claim 13, wherein A is Si.

16. The composition of claim 11, wherein from 0.5 to 50 vol % of said composition consists essentially of said compound.

17. The composition of claim 16, wherein from 1 to 35 vol % of said composition consists essentially of said compound.

18. The composition of claim 17, wherein from about 5 to 25 vol % of said composition consists essentially of said compound.

19. The composition of claim 11, wherein from about 1 to about 25 wt. % of said composition consists essentially of said compound, and dopant is present in an amount providing from about 0.0001 to about 10 at. % of B atoms with respect to A atoms in said compound.

20. The composition of claim 1, wherein said dopant has the formula $BR^1{}_3$ and/or $(R^2{}_3A)_rA(BR^1{}_2)_s$, where $R^1$ is $C_3$-$C_6$ alkyl, $R^2$ is hydrogen, r+s=4, and s≧3.

21. The composition of claim 1, wherein aralkyl is $C_7$-$C_{10}$ aralkyl, and aryl is $C_6$-$C_{10}$ aryl.

* * * * *